US008072615B2

(12) United States Patent
Musa et al.

(10) Patent No.: US 8,072,615 B2
(45) Date of Patent: Dec. 6, 2011

(54) ALIGNMENT METHOD, ALIGNMENT SYSTEM, AND PRODUCT WITH ALIGNMENT MARK (75) Inventors: Sami Musa, Veldhoven (NL); Richard Johannes Franciscus Van Haren, Waalre (NL); Sanjaysingh Lalbahadoersing, Helmond (NL); Xiuhong Wei, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 412 days.

(21) Appl. No.: 12/332,953

(22) Filed: Dec. 11, 2008

(65) Prior Publication Data
US 2009/0153861 A1 Jun. 18, 2009

Related U.S. Application Data (60) Provisional application No. 60/996,999, filed on Dec. 13, 2007.

(51) Int. Cl.
*G01B 11/14* (2006.01)
*G01B 11/00* (2006.01)
*G03F 1/00* (2006.01)
*G03F 7/00* (2006.01)
*H01L 21/00* (2006.01)

(52) U.S. Cl. ............. 356/620; 356/401; 430/5; 430/311
(58) Field of Classification Search .................... None
See application file for complete search history.

(56) References Cited

U.S. PATENT DOCUMENTS

| | | | |
|---|---|---|---|
| 5,418,613 A * | 5/1995 | Matsutani | 356/401 |
| 5,777,392 A | 7/1998 | Fujii | |
| 6,521,900 B1 | 2/2003 | Hirayanagi | |
| 6,844,918 B2 | 1/2005 | Koren et al. | |
| 7,372,565 B1 * | 5/2008 | Holden et al. | 356/327 |
| 7,800,824 B2 * | 9/2010 | Wang et al. | 359/566 |
| 7,803,502 B2 | 9/2010 | Sato et al. | |

(Continued)

FOREIGN PATENT DOCUMENTS

EP 0 595 020 A2 5/1994

(Continued)

OTHER PUBLICATIONS

Megens et al., "Advances in Process Overlay—Alignment Solutions for Future Technology Nodes", Metrology, Inspection, and Process Control for Microlithography XXI, Proceedings of SPIE, vol. 6518, Part 2 of 3, Feb. 2007, 13 pgs.

(Continued)

*Primary Examiner* — Gregory J Toatley
*Assistant Examiner* — Juan D Valentin
(74) *Attorney, Agent, or Firm* — Sterne, Kessler, Goldstein & Fox P.L.L.C.

(57) ABSTRACT

The position of a product is measured using an alignment mark on the product. Radiation is transmitted towards the alignment mark and diffracted by a pattern in the alignment mark. Position information is determined from phase relations of the diffracted radiation. The alignment mark comprises a set of mutually parallel conductor tracks from which the diffracted radiation is collected, the pattern being defined by a pattern of variation of the pitch between successive tracks as a function of position along the surface of the product. Thus, for example the pattern comprises alternating first and second areas wherein the pitch has a first and second value, respectively. Because the tracks in the different parts of the pattern, such as the first and second areas, are parallel to each other improved measurements are possible.

15 Claims, 7 Drawing Sheets

U.S. PATENT DOCUMENTS

| | | | |
|---|---|---|---|
| 2005/0146699 A1* | 7/2005 | Levasier et al. ............... | 355/53 |
| 2005/0184234 A1* | 8/2005 | Nakayama ................... | 250/311 |
| 2005/0195398 A1* | 9/2005 | Adel et al. .................... | 356/401 |
| 2006/0091330 A1* | 5/2006 | Van Bilsen et al. ........... | 250/548 |
| 2007/0052113 A1 | 3/2007 | Marokkey et al. | |
| 2007/0114678 A1 | 5/2007 | Van Haren et al. | |
| 2008/0008941 A1* | 1/2008 | Sato et al. ..................... | 430/5 |

FOREIGN PATENT DOCUMENTS

| | | |
|---|---|---|
| EP | 0 823 667 A2 | 2/1998 |
| JP | 63-153818 A | 6/1988 |
| JP | 07-225113 A | 8/1995 |
| JP | 08-264423 A | 10/1996 |
| JP | 10-270347 A | 10/1998 |
| JP | 2000-252190 A | 9/2000 |
| JP | 2004-279405 A | 10/2004 |
| JP | 2004-282017 A | 10/2004 |
| JP | 2008-003520 A | 1/2008 |

OTHER PUBLICATIONS

First Office Action mailed Feb. 12, 2010 for Chinese Application No. 200810185523.2, 3 pgs.

Search Report for Singapore Application No. 200808908-8 mailed Oct. 2, 2009, 4 pgs.

English language Abstract of Japanese Patent Publication No. 63-153818 A, published Jun. 27, 1988, the Japanese Patent Office; 1 page.

English language Abstract of Japanese Patent Publication No. 07-225113 A, published Aug. 22, 1995, the Japanese Patent Office; 1 page.

English language Abstract of Japanese Patent Publication No. 08-264423 A, published Oct. 11, 1996, the Japanese Patent Office; 1 page.

English language Abstract of Japanese Patent Publication No. 10-270347 A, published Oct. 9, 1998, the Japanese Patent Office; 1 page.

English language Abstract of Japanese Patent Publication No. 2000-252190 A, published Sep. 14, 2000, the Japanese Patent Office; 1 page.

English language Abstract of Japanese Patent Publication No. 2004-279405 A, published Oct. 7, 2004, the Japanese Patent Office; 1 page.

English language Abstract of Japanese Patent Publication No. 2004-282017 A, published Oct. 7, 2004, the Japanese Patent Office; 1 page.

English language Abstract of Japanese Patent Publication No. 2008-003520 A, published Jan. 10, 2008, the Japanese Patent Office; 1 page.

English translation of Japanese Notice of Reasons for Rejection, directed to related Japanese Application No. 2008-309352, mailed May 6, 2011; 3 pages.

* cited by examiner

FIG 1

ALIGNMENT METHOD, ALIGNMENT SYSTEM, AND PRODUCT WITH ALIGNMENT MARK

CROSS-REFERENCE TO RELATED APPLICATION

This application claims priority to U.S. Application No. 60/996,999 filed on Dec. 13, 2007. The subject matter of that application is incorporated herein by reference as if fully set forth herein.

BACKGROUND

1. Field of Invention

In general terms, the invention relates to a product with an alignment mark thereon, a method of aligning a product and a method for manufacturing a device.

2. Related Art

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) of a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Substrates and patterning devices need to be very accurately aligned during exposure. It is known to provide optical alignment marks on the substrate and/or patterning device for this purpose. One known alignment mark has reflection properties that vary periodically as a function of position, so that the mark can be used as an optical grating. The period of such a grating may be sixteen micron for example, when light with a wavelength of about 0.6 micron is used to measure position. An optical system measures the position of the substrate and/or patterning device by forming an image of the diffracted light using selected orders of diffraction from this grating. In a simple alignment mark each period of the periodic variation is realized by one area of high reflection (e.g., metal) and one area of low reflection (e.g., oxide), for example one eight micron wide area of metal and one eight micron wide area of oxide in each period.

Two such alignment marks may be used, one wherein the periodic areas repeat in a first direction along the surface of the wafer (the X-axis) and one wherein the periodic areas repeat in a second direction along the surface of the wafer (the Y-axis). Moreover, typically alignment measurements are performed with light of two wavelengths.

However, an alignment mark with periods made up of two homogeneous areas tends to make use of homogeneous areas of sizes that are much larger than that of tracks in modern integrated circuits. In response, it is possible to construct the different areas in each period of the alignment mark from finer lines. From an article titled "Advances in Process overlay-Alignment Solutions for Future Technology Nodes", in Metrology, Inspection and Process Control for Microlithography XXI (Chas N. Archie editor) Proc SPIE Vol 6518 by Henry Megens et al. an alignment mark is known wherein the periodic structure comprises alternately a first area with fine conductive tracks directed along a first direction and second areas with fine conductive tracks directed along a second direction perpendicular to the first direction. The distance between these conductive tracks is made smaller than the wavelength of the light that is used to measure the position of the alignment mark.

Such line patterns results in a wired grid polarization effect, whereby polarization components of the light with electric field components parallel and perpendicular to the tracks are mainly reflected and transmitted respectively. Because the direction of the tracks alternates in the alignment mark, such an alignment mark provides an offset between the periodically varying reflection properties for the respective polarization components. As a pattern of variation of the direction gives rise to diffraction: the pattern of directions acts as a diffraction grating that produces different orders of diffraction at different angles. Light from these orders of diffraction is used to measure the position of the alignment mark.

Unfortunately, this type of alignment mark is incompatible with the use of diffractive imaging techniques that use pairs of orders of diffraction. An example of such imaging technique is the dipolar illumination method. In the dipolar illumination method light falls on the mask at an oblique angle of incidence with respect to the optical axis of the illumination system. Light with an oblique angle of incidence will generate transmitted diffraction orders that have large diffraction angles. The projection system may be configured to capture only the zero and the first transmitted diffraction orders and projects them on the resist layer constructing an image of the grating. If the grating lines are perpendicular to the plane of incidence that contains the optical axis and the wave-vector of the incident beam, a sharp image of the grating will be formed on the resist layer. But if the gratings lines are parallel to this plane of incidence a poor resolved image of the grating will be formed on the resist layer. The poor image results in a grating with different parameters or no grating at all. If the alignment mark period consists of sub-wavelength lines that are perpendicular in directions, lines in one direction will be well resolved and the lines in the perpendicular direction will not be resolved under dipolar or polarized illumination. When alignment marks in the X and Y direction are used that are the same except for a rotation over ninety degrees, the same polarization component cannot be used to measure the position of both X and Y marks.

SUMMARY

It is desirable to provide a product with an alignment mark that allows for spatially varying reflective properties from a pattern of fine lines for different polarization components for radiation of selectable orders of diffraction.

According to an aspect of the invention, there is provided a method of measuring a position of a product, the method comprising:
transmitting electromagnetic radiation towards an alignment mark at a surface of the product;
collecting radiation diffracted by the alignment mark;
determining position information from phase relations of the diffracted radiation, wherein the alignment mark comprises a set of mutually parallel conductor tracks from which the diffracted radiation is collected having a pitch between successive tracks, the pitch of the tracks in the set varying as a function of position along the surface of the product, angles along which the collected diffraction of said radiation occurs depending on a pattern of variation of the pitch of the tracks in the set as a function of position.

According to an aspect of the invention, there is provided an alignment system comprising     an electromagnetic radiation source configured to transmit electromagnetic radiation;

a product to be aligned, the product comprising an alignment mark for receiving the radiation, the alignment mark comprising a set of mutually parallel conductor tracks having a pitch between successive tracks, the pitch of the tracks in the set varying as a function of position along the surface of the product, angles along which the collected diffraction of the radiation occurs depending on a pattern of variation of the pitch of the tracks in the set as a function of position;

a detector configured to image light from selected diffraction orders from electromagnetic radiation diffracted from the alignment mark.

According to an aspect of the invention, there is provided a photolithographic apparatus comprising such an alignment system, wherein the product is a semi-conductor wafer.

According to an aspect of the invention, there is provided a product comprising an alignment mark, the alignment mark comprising a set of mutually parallel conductor tracks having a pitch between successive tracks, the pitch of the tracks in the set varying as a function of position along the surface of the product, angles along which diffraction occurs depending on a pattern of variation of the pitch as a function of position.

According to an aspect of the invention, there is provided a device manufacturing method comprising:

transferring a pattern from a patterning device onto a product comprising the device during manufacture, wherein the transferring comprises aligning the substrate according to a method comprising:

transmitting electromagnetic radiation towards an alignment mark at a surface of the product;

collecting radiation diffracted by the alignment mark; and     determining position information from phase relations of the diffracted radiation, wherein the alignment mark comprises a set of mutually parallel conductor tracks from which the diffracted radiation is collected, having a pitch between successive tracks, the pitch of the tracks in the set varying as a function of position along the surface of the product, angles along which the collected diffraction of said radiation occurs depending on a pattern of variation of the pitch of the tracks in the set as a function of position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
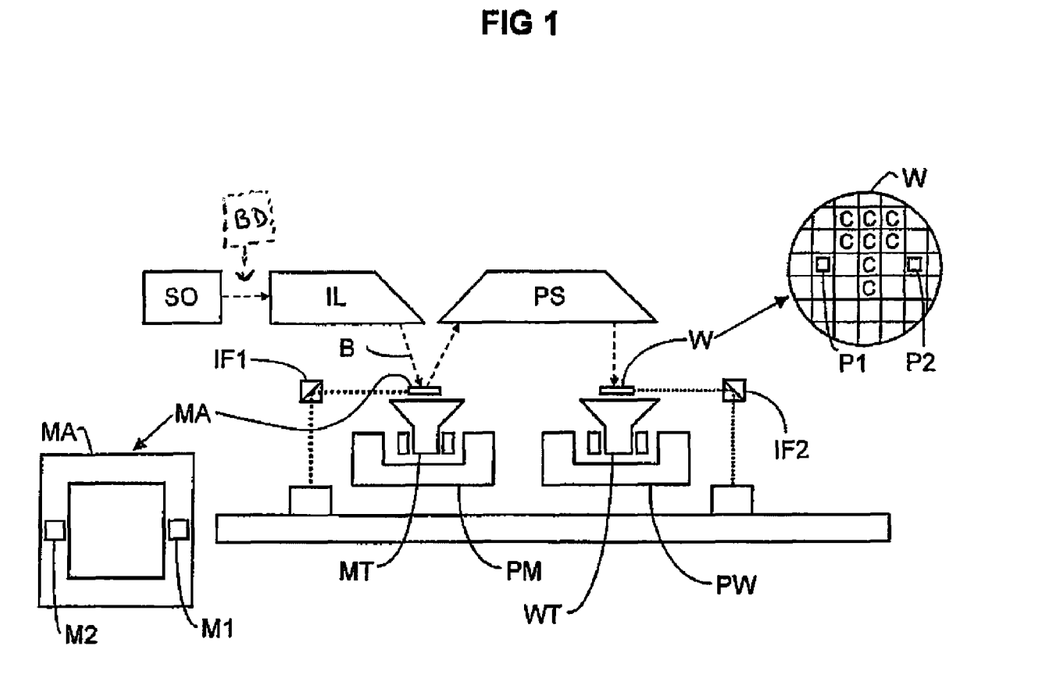
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a beam B of electromagnetic radiation, for example in the visible, UV or EUV wavelength range.

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and     a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The first positioner PM and/or the other position sensor IF1 make use of an optical measurement system in the lithographic apparatus and an alignment mark on substrate W and/or patterning device M.

Figure 2:
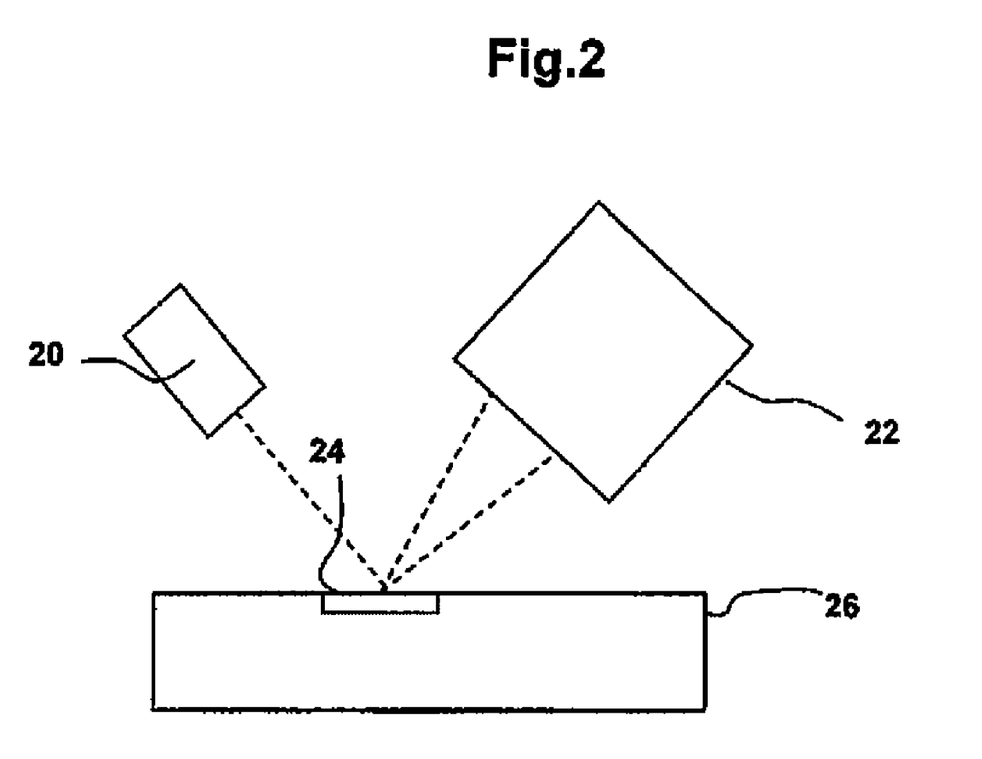
FIG. 2 shows an optical measurement system

FIG. 2 shows an optical measurement system comprising a light source 20 and a phase coherent detector 22. In operation, light source 20 supplies light (or more generally electromagnetic radiation) to an alignment mark 24 on a product 26 (substrate W or patterning device M). A specular reflection efficiency of alignment mark 24 varies as a function of position on the surface of the alignment mark 24. As a result the light is diffracted from alignment mark 24. The diffracted light is collected by phase coherent detector 22. Phase coherent detector 22 selects light from two respective orders of diffraction and forms an image of the alignment mark using the selected orders of reflection. Thus, intensity variation in the image depends on the phase relation between the light from the selected orders of diffraction. Techniques for such phase coherent position determinations are known per se, for example from an article by Ramon Navarro, Stefan Keij, Arne den Boef, Sicco Schets, Frank van Bilsen, Geert Simons, Ron Schuurhuis, Jaap Burghoom, titled "Extended ATHENATM alignment performance and application for the 100 nm technology node, published in the Proceedings of SPIE Vol. 4344 (2001). As the present invention can be understood without detailed knowledge of such techniques, they will not be explained in detail here.

Figure 3:
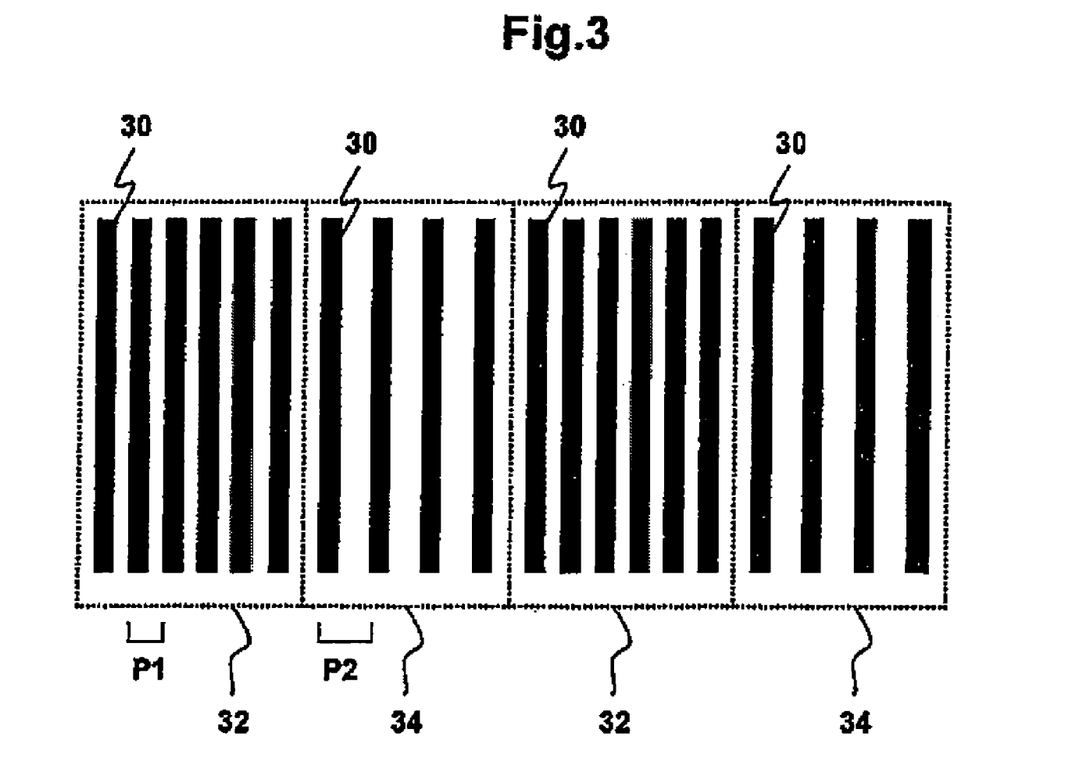
FIG. 3 shows a top view of part of an alignment mark
Figure 3A:
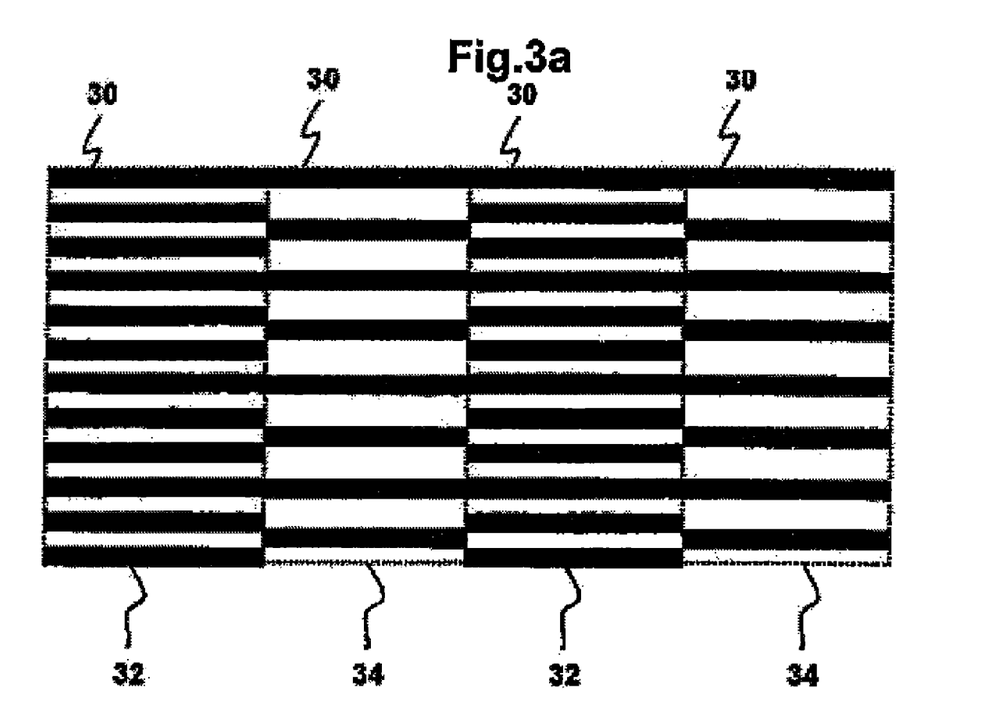
FIG. 3a shows a top view of part of an alternative alignment mark

FIG. 3 shows a top view of part of an embodiment of the alignment mark. This part comprises conductive tracks 30 (only a few labeled, by way of example), which are all oriented in the same direction. FIG. 3a shows part of an alternative alignment mark. The pitch of tracks 30, i.e., the distance between the start of successive tracks (the inverse of track density, the number of tracks per unit distance), varies as a function of position. Alternating first and second areas 32, 34 can be distinguished, with a first and second pitch value P1, P2, respectively. The pattern of variation of pitch values, in the case of these figures an alternation of areas 32, 34, causes the diffraction that is used for the measurement. Thus instead of a pattern of direction variations of the tracks 30, a pattern of pitch variation is used to produce the selectable diffraction orders for measuring position. The angles of diffraction depend on the pitch of this pattern of pitch variation, that is, the areas function as individual bars of a grating. The pitch of individual tracks 30 underlies this pattern and is necessarily smaller than the pitch of the pattern of areas 32, 34. The individual tracks are effectively not used as individual bars of a diffraction grating to produce the selectable diffraction orders for measuring position. Their effect as such is small because the pitch of the tracks is typically much smaller than the wavelength of the radiation and because the periodicity of repetitions of individual tracks at the same pitch does not extend over large areas.

The pitch of tracks 30 in areas 32, 34 is selected to provide the most reflected polarization component is different in the first and areas 32, 34 respectively. Typically, the distance between successive boundaries between areas 32, 34 (i.e., the width of the areas) is much larger than the wavelength of the light used for position measurement, e.g., at least ten times the wavelength. In an example where the wavelength is about 0.5 micrometer, a width of 8 micrometer may be used for example, resulting in a periodicity of 16 micrometer. The pitch between successive tracks 30 is typically less than the wavelength.

Figure 4:
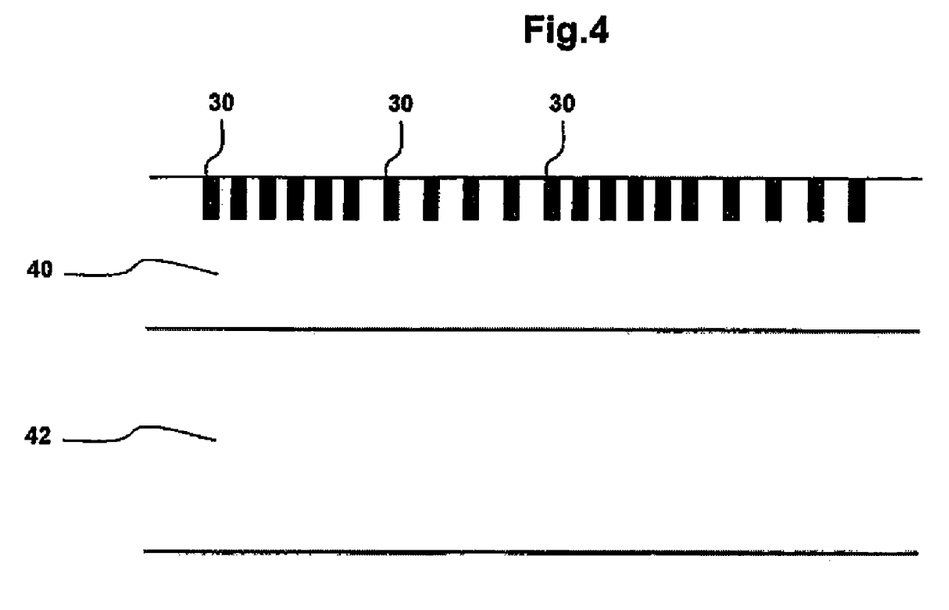
FIG. 4 shows a side view of part of an alignment mark

FIG. 4 shows side view of the alignment mark of FIG. 3 in cross-section. Tracks 30 comprise conductive material embedded in a layer 40 of non-conductive material. Layer 40 is provided on a substrate 42, which may be a semi-conductor wafer with or without partially manufactured circuit structures. In an embodiment tracks may comprise a metal, such as copper, and layer 40 may be made of Silicon oxide or Silicon carbide.

Figure 5:
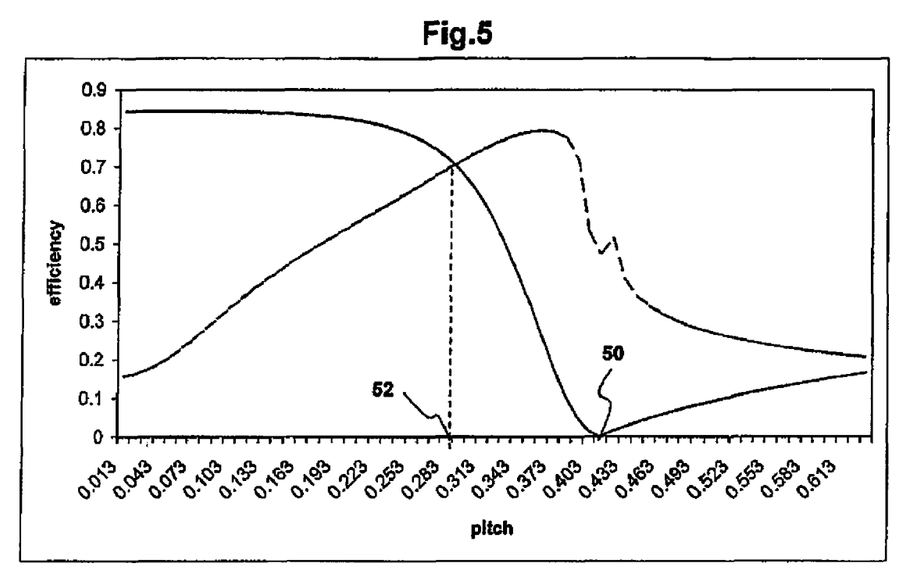
FIG. 5 shows a graph of reflectivity as a function of pitch for one wavelength

FIG. 5 is a graphical representation of theoretical reflection efficiency as a function of pitch for light of one wavelength (red light-633 nm) and two different polarization components, with the electric field of the light parallel and perpendicular to tracks 30 respectively. As can be seen, at small pitch reflection efficiency is high for a first polarization component and low for the second component. This corresponds to a wire grid polarization effect. Furthermore, it can be seen that the reflection efficiency for the first component drops to zero, or near zero, with increasing pitch until a pitch value at a minimum 50 is reached, above which the efficiency rises to an asymptotic value. In contrast, the reflection efficiency for the second component increases with increasing pitch, reaching a peak at about the pitch value at the minimum 50 where the reflection efficiency for the first component is zero, after which it drops to the asymptotic value. The reflection efficiencies for the first and second components cross each other at a crossing pitch value 52.

In an embodiment the pitch in the first areas 32 of the alignment mark has a first value corresponding to the pitch value where reflection efficiency for the first component is zero in FIG. 5. In the second areas 34 the pitch has a second value, well below the first value. As a result an alignment mark is realized wherein reflection efficiency varies periodically as a function of position for both polarization components, but with a phase offset of half a period as a function of position between the two polarization components.

It should be noted that a similar effect can be reached also when the pitch is not exactly equal to the first value where reflection efficiency for the first component is zero. Any difference between the pitch in first and second areas 32, 34 leads to some variation of reflection efficiency as a function of position for both polarization components. In an embodiment the pitch values in first and second areas 32, 34 are on mutually opposite sides of the crossing pitch value 52. Thus, the different polarization components will have highest reflection efficiency in the first and second areas 32, 34, respectively.

Figure 5A:
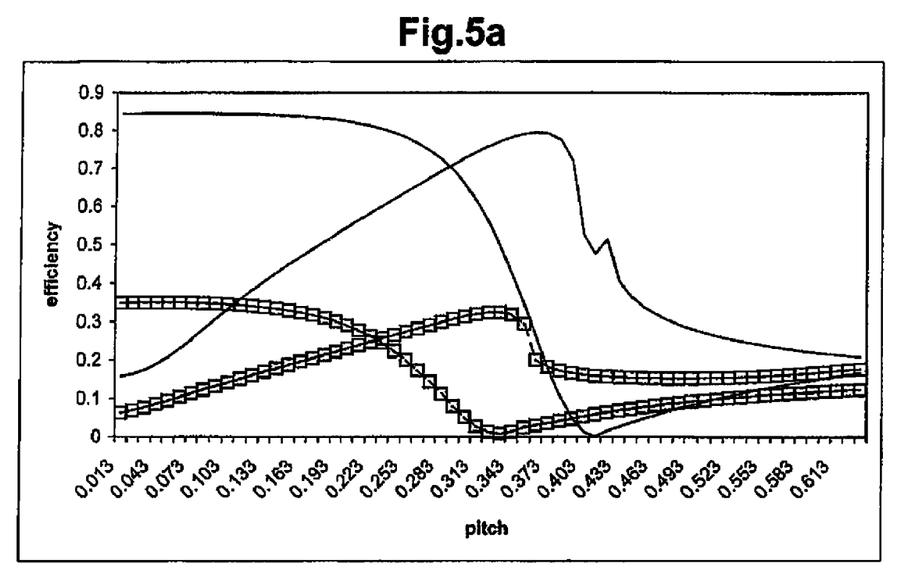
FIG. 5a shows a graph of reflectivity as a function of pitch for two wavelengths

FIG. 5a shows theoretical reflection efficiency as a function of pitch for light of two different wavelengths (red and green light). In addition to the curves shown in FIG. 5 for red light, additional curves (marked with squares) are shown for another wavelength (green light-533 nm). As can be seen the effect for both wavelengths is similar, except that the minimum occurs at different pitch values for different wavelengths. In an embodiment position measurements are performed using a plurality of wavelengths for measuring reflection properties from the same alignment mark. In this embodiment the pitch values in the different areas and the wavelengths may be selected so that the pitch values in first and second areas 32, 34 are on mutually opposite sides of the crossing pitch value 52 for each of the wavelengths. As can be seen form FIG. 5a this is possible for light with wavelength in the red and green range. However, other wavelengths may be selected as alternatives or in addition.

Although an embodiment has been shown wherein the longest axis of all conductive tracks 30 is parallel to the boundaries between first and second areas 32, 34, it should be appreciated that alternatively the long axis may be perpendicular to that boundary (at an angle of ninety degrees), as shown in FIG. 3a, or transverse to the boundary at any other angle. The angle and the dipole direction (the plane through the direction vectors of different diffraction orders) may be selected in correspondence with each other, so that the dipole direction is aligned with the long axis. Use of conductive tracks 30 directed parallel to the boundaries between first and second areas 32, 34 generally results in an option to use conductive tracks 30 of arbitrary length, independent of the distance between successive area boundaries.

In an embodiment at least two alignment marks, with periodicity in mutually different directions are used, to perform measurement in the X and Y direction along the surface of substrate W. Also a checkerboard type alignment mark may be used, wherein the pattern of areas is periodic in two directions at an angle relative to each other, for example at a ninety degree angle. Although an embodiment has been shown wherein a periodic arrangement of first and second areas 32, 34 is used, which makes it possible to use a simple order selection system, it should be appreciated that alternatively non-periodic arrangements of areas of conductor tracks with different pitch distances between the conductor tracks in different areas. Positions may be measured form such alignment marks using holographic correlation techniques for example. In a further embodiment a variable pitch may be used, which varies as a function of position between the pitch value at minimum 50 and a pitch value below crossing pitch value 52.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring a position of a product, the method comprising:
    transmitting electromagnetic radiation towards an alignment mark at a surface of the product;
    collecting radiation diffracted by the alignment mark; and
    determining position information from phase relations of the diffracted radiation,
    wherein the alignment mark comprises a first set of parallel conductor tracks having a first pitch between successive tracks, and comprises a second set of parallel conductor tracks having a second pitch between successive tracks, the first pitch varying from the second pitch, and
    wherein angles along which the collected diffraction of said radiation occurs depend on the variation between the first pitch and the second pitch.

2. A method according to claim 1,
    wherein transmitting electromagnetic radiation comprises transmitting electromagnetic radiation having first and second orthogonal polarization components, and having a wavelength at which a reflection efficiency from the first set of parallel conductor tracks for the first polarization component is higher than a reflection efficiency from the first set of parallel conductor tracks for the second polarization component, and at which a reflection efficiency from the second set of parallel conductor tracks for the first polarization component is lower than a reflection efficiency from the second set of parallel conductor tracks for the second polarization component.

3. A method according to claim 2, wherein the alignment mark further comprises a third set of parallel conductive tracks having the first pitch between successive tracks, and a fourth set of parallel conductive tracks having the second pitch between the successive tracks, the third and fourth set of parallel conductive tracks being arranged in a periodic arrangement with the first and second sets of parallel conductive tracks.

4. A method according to claim 1,
    wherein transmitting electromagnetic radiation comprises transmitting electromagnetic radiation at a wavelength having a crossing pitch value at which reflection efficiencies for the first and second polarization components are equal, and
    wherein the first pitch is less than the crossing pitch value, and the second pitch is more than the crossing pitch value.

5. A method according to claim 4, wherein transmitting electromagnetic radiation comprises transmitting electromagnetic radiation at the wavelength further having a pitch value at minimum reflection efficiency for the first polarization component, and
    wherein the second pitch value is about equal to the pitch value at minimum reflection efficiency for the first polarization component.

6. A method according to claim 5, wherein transmitting electromagnetic radiation further comprises transmitting electromagnetic radiation having third and fourth orthogonal polarization components, and having a second wavelength different from the wavelength of the first and second polarization components, the second wavelength having a reflection efficiency from the first set of parallel conductor tracks for the third polarization component that is higher than a reflection efficiency from the first set of parallel conductor tracks for the fourth polarization component, and having a reflection efficiency from the second set of parallel conductor tracks for the third polarization component that is lower than a reflection efficiency from the second set of parallel conductor tracks for the fourth polarization component.

7. A method according to claim 1, wherein the first and second sets of parallel conductor tracks are parallel to a boundary between the first and second sets of parallel conductor tracks.

8. An alignment system comprising:
an electromagnetic radiation source configured to transmit electromagnetic radiation;
a product to be aligned, the product comprising an alignment mark for receiving the radiation, the alignment mark comprising a first set of parallel conductor tracks having a first pitch between successive tracks, and a second set of parallel conductor tracks having a second pitch between successive tracks, the first pitch varying from the second pitch, angles of diffraction of radiation depending on the variation between the first pitch and the second pitch; and
a detector configured to detect light from selected diffraction orders from electromagnetic radiation diffracted from the alignment mark.

9. An alignment system according to claim 8, wherein the electromagnetic radiation includes first and second orthogonal polarization components at a wavelength having a reflection efficiency from the first set of parallel conductor tracks for the first polarization component higher than a reflection efficiency from the first set of parallel conductor tracks for the second polarization component, and having a reflection efficiency from the second set of parallel conductor tracks for the first polarization component lower than a reflection efficiency from the second set of parallel conductor tracks for the second polarization component.

10. A photolithographic apparatus comprising an alignment system, the alignment system comprising:
an electromagnetic radiation source configured to transmit electromagnetic radiation;
a semiconductor wafer to be aligned, the wafer having an alignment mark comprising a first set of parallel conductor tracks having a first pitch between successive tracks, and a second set of parallel conductor tracks having a second pitch between successive tracks, the first pitch varying from the second pitch, angles of diffraction of radiation incident on the alignment mark depending on the variation between the first pitch and the second pitch; and
a detector configured to detect light from selected diffraction orders from electromagnetic radiation diffracted by the alignment mark.

11. A photolithographic apparatus according to claim 10, wherein electromagnetic radiation includes first and second orthogonal polarization components at a wavelength having a reflection efficiency from the first set of parallel conductor tracks for the first polarization component higher than a reflection efficiency from the first set of parallel conductor tracks for the second polarization component and having a reflection efficiency from the second set of parallel conductor tracks for the first polarization component lower than a reflection efficiency from the second set of parallel conductor tracks for the second polarization component.

12. A product comprising:
an alignment mark, wherein the alignment mark comprises:
a first set of parallel conductor tracks having a first pitch between successive tracks; and
a second set of parallel conductor tracks having a second pitch between successive tracks,
wherein the first pitch varies from the second pitch, and
wherein angles along which diffraction occurs depend on the variation between the first pitch and the second pitch.

13. A product according to claim 12, wherein the first pitch has a value such that a reflection efficiency from the first set of parallel conductor tracks for a first polarization component of diffracted radiation is higher than a reflection efficiency from the first set of parallel conductor tracks for a second polarization component of diffracted radiation that is orthogonal to the first polarization component, and such that a reflection efficiency from the second set of parallel conductor tracks for the first polarization component is lower than a reflection efficiency from the second set of parallel conductor tracks for the second polarization component.

14. A device manufacturing method comprising:
transferring a pattern from a patterning device onto a product comprising the device during manufacture,
wherein the transferring comprises aligning the product according to a method comprising:
transmitting electromagnetic radiation towards an alignment mark at a surface of the product;
collecting radiation diffracted by the alignment mark; and
determining position information from phase relations of the diffracted radiation,
wherein the alignment mark comprises a first set of parallel conductor tracks having a first pitch between successive tracks, and a second set of parallel conductor tracks having a second pitch between successive tracks from which the diffracted radiation is collected, the first pitch varying from the second pitch, angles along which the collected diffraction of said radiation occurs depending on the variation between the first pitch and the second pitch.

15. A method according to claim 14, wherein transmitting electromagnetic radiation towards the alignment mark at the surface of the product comprises transmitting electromagnetic radiation having first and second orthogonal polarization components at a wavelength having a reflection efficiency from the first set of parallel conductor tracks for the first polarization component that is higher than a reflection efficiency from the first set of parallel conductor tracks for the second polarization component, and having a reflection efficiency from the second set of parallel conductor tracks for the first polarization component that is lower than a reflection efficiency from the second set of parallel conductor tracks for the second polarization component.

* * * * *